(12) United States Patent
Nakamura

(10) Patent No.: US 7,266,341 B2
(45) Date of Patent: Sep. 4, 2007

(54) DIGITAL BROADCAST RECEIVING DEVICE AND DIGITAL BROADCAST RECEIVING METHOD

(75) Inventor: Hideki Nakamura, Hyogo (JP)

(73) Assignee: Fujitsu Ten Limited, Kobe (JP)

( * ) Notice: Subject to any disclaimer, the term of this patent is extended or adjusted under 35 U.S.C. 154(b) by 555 days.

(21) Appl. No.: 10/662,222

(22) Filed: Sep. 15, 2003

(65) Prior Publication Data

US 2004/0117855 A1 Jun. 17, 2004

(30) Foreign Application Priority Data

Sep. 24, 2002 (JP) .............................. 2002-277858

(51) Int. Cl.
*H04H 1/00* (2006.01)
*H04B 7/00* (2006.01)
*H05K 11/00* (2006.01)

(52) U.S. Cl. .................... 455/3.01; 455/66.1; 455/344; 334/48

(58) Field of Classification Search ............... 455/3.01, 455/3.04, 3.06, 66.1, 344; 334/48
See application file for complete search history.

(56) References Cited

U.S. PATENT DOCUMENTS 6,118,498 A * 9/2000 Reitmeier .................... 348/725
6,542,203 B1 * 4/2003 Shadwell et al. ............ 348/726
6,658,231 B2 * 12/2003 Nakatsuyama ............. 455/3.06
6,928,262 B1 * 8/2005 Kanemitsu .................. 455/3.06
6,965,758 B2 * 11/2005 Takagi ....................... 455/154.1

FOREIGN PATENT DOCUMENTS

JP    A 2000-287143    10/2000

* cited by examiner

*Primary Examiner*—Tilahun Gesesse
(74) *Attorney, Agent, or Firm*—Oliff & Berridge, PLC

(57) ABSTRACT

A tuner receives service information SI for each of a plurality of channels included in a digital broadcasting signal at one carrier frequency. A service information extraction unit extracts and stores the received service information preset into a memory. The operator selects the service information stored in the memory and acquires a program. The tuner may have a function of automatically scanning the carrier frequency all over the receivable frequency bands and store it. The temporary service information having irregular broadcast time is stored in the memory through an operation of an operation input unit. When the temporary service information is not broadcast, such temporary service information is deleted from the memory.

7 Claims, 12 Drawing Sheets

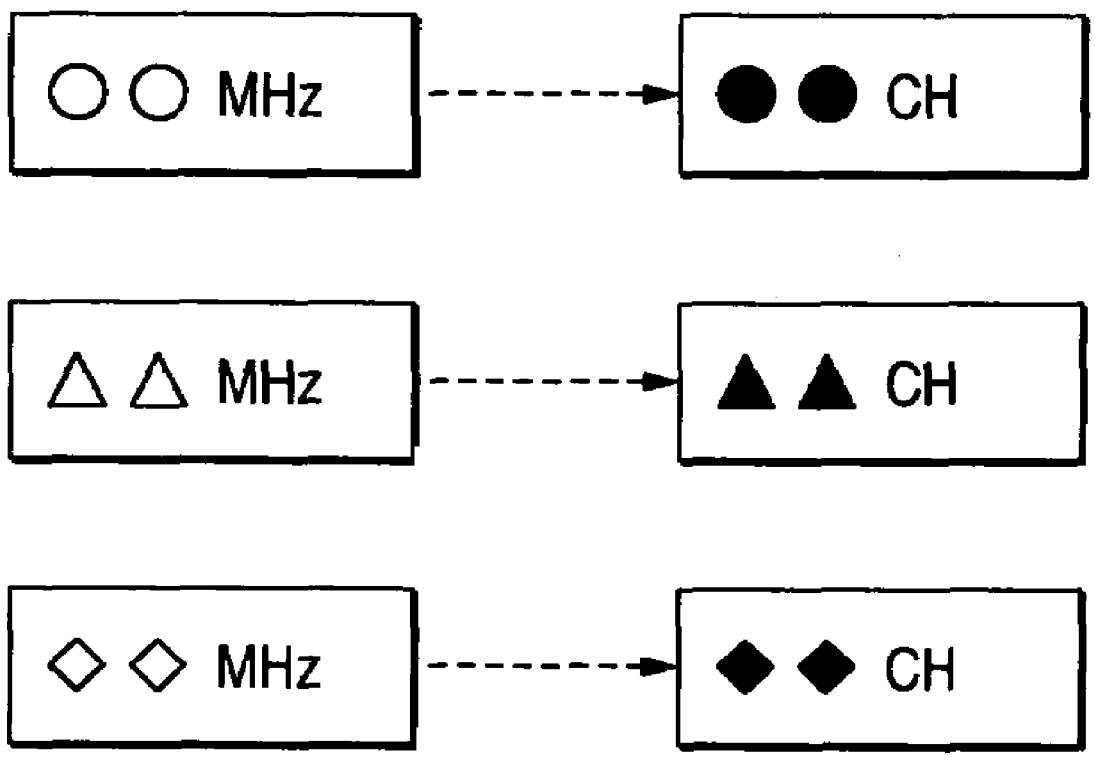

DIGITAL BROADCAST RECEIVING DEVICE AND DIGITAL BROADCAST RECEIVING METHOD

The present disclosure relates to the subject matter contained in Japanese Patent Application No. 2002-277858 filed on Sep. 24, 2002, which is incorporated herein by reference in its entirety.

BACKGROUND OF THE INVENTION

1. Field of the Invention

The present invention relates to a digital broadcast receiving apparatus for receiving a digital broadcast signal such as terrestrial broadcasting or satellite broadcasting.

2. Description of the Related Art

In a typical prior technique, service information regarding channels is stored in a unit of channel in the memory, with one channel CH corresponding to a certain carrier frequency, as shown in FIG. 14. By selecting the carrier frequency in a preset form of channel, the channel is determined. Thereby, one can watch or listen to a program on television broadcasting or radio broadcasting through a desired channel.

In such prior technique, since a digital broadcast signal involves a plurality of channels included in one carrier frequency, one cannot watch or listen to a desired channel program by selecting it, even though the channel is preset for the carrier frequency.

SUMMARY OF THE INVENTION

It is an object of the invention to provide a digital broadcast receiving apparatus, which can selectively acquire a program through a plurality of channels included in one carrier frequency.

A digital broadcast receiving apparatus according to embodiments of the invention, a tuner for receiving a coded digital broadcast signal, a decoding unit for decoding and outputting the received digital broadcast signal, an extraction unit for extracting service information of each of plural channels from the decoded digital broadcast signal.

The digital broadcast receiving apparatus may further include a memory for storing the extracted service information thereinto.

The service information may be a plurality pieces of service information. Each of channels may contain a plurality of services. The plurality pieces of service information may relate to the services, respectively.

According to the embodiments of the invention, in the digital broadcast signal at the carrier frequency, a data stream of programs is multiplexed into a multi-channel data stream, and transmitted at a single carrier frequency. The digital broadcast signal has video data and sound data compressed in an MPEG (Moving Picture Experts) compression format and multiplexed. The video data and sound data encoded in a transport stream (abbreviated as TS) format for each channel are packetized, and transmitted in a PES (Packetized Elementary Stream) format. The TS is a bit stream or data sequence when multiplexing the coded data of a plurality of programs compressed in the MPEG compression format. The video data, sound data and additional data encoded in the MPEG compression format are multiplexed using the TS defined in the MPEG compression format.

The teletext data included in the data stream and SI data providing the detailed information of a broadcast program are also defined, in which the error correction refers to Reed Solomon (abbreviated as RS) code. These are received at one carrier frequency. All the service information SI (Service Information) residing in the TS included in the data broadcast signal is stored into the memory. SI includes the program information such as a channel name, a program name, and a broadcast date and time. Also, SI includes an Electronic Program Guide (abbreviated as EPG). TS includes the Program Specific Information (abbreviated as PSI). PSI mainly includes a channel selection (selection of transponder) and the information necessary for channel selection.

One of the carrier frequencies is selected, and one of the channels included in this selected carrier frequency is decided, whereby video data or sound data through a desired channel is acquired based on the stored service information.

According to the embodiments of the invention, the tuner may scan carrier frequencies of the digital broadcast signal to receive one carrier frequency. After the memory stores the service information, the tuner may scan the carrier frequency to receive another carrier frequency.

The tuner can achieve an automatic preset function of automatically repeating the storing operation in the memory for a plurality of different carrier frequencies received at present. In this way, the tuner scans the carrier frequency in order while changing it, receives the digital broadcast signal through the plurality of channels at a receivable carrier frequency or a carrier frequency at which receiving field strength is a preset value or greater, and stores the service information in the memory. Thus, SI can be preset in the memory all over the band of receivable carrier frequencies of the tuner, whereby the storing operation is facilitated without the operator needing to set the carrier frequency. The operator can easily select a program stored in the memory, and receive and view the program.

Also, the digital broadcast receiving apparatus according to the embodiments of the invention may further include a broadcast selection unit for selecting one from a group consisting of a television broadcasting, a radio broadcasting, and a data broadcasting, and a first storage unit for storing the service information of the selected one into the memory.

Among the services residing in the TS at received carrier frequency, the service information for one of the television broadcasting, radio broadcasting and data broadcasting is selected, and stored in the memory. In this manner, the data is analyzed and retrieved for the service or channel residing in the TS from the digital broadcast signal received by the tuner, and the data necessary for deciding each service and regarding the television broadcasting is extracted from the data regarding the service residing in the TS, and stored in the memory.

Instead of the television broadcasting, the data regarding the sound service of radio broadcasting or the data regarding the data broadcasting service may be employed. In this manner, one of the television broadcasting, radio broadcasting and data broadcasting is selected, and its service is automatically preset in the memory.

Accordingly, the user is relieved from the troublesome operation, with the enhanced operability. Also, if the data regarding the service of television broadcasting is only preset, and other services of radio broadcasting and data broadcasting are not preset in the memory, a desired service only is easily searched and selected from the stored contents of the memory at the subsequent time and beyond in efficient manner. The service may be a program name or a genre.

Also, the digital broadcast receiving apparatus according to the embodiments of the invention may further include a storage selection unit for selecting as to whether or not to store temporal service information into the memory, and a second storage unit, which stores the temporal service information into the memory when the storage selection unit selects to store the temporal service information into the memory.

One or more of the temporary service information, for example, temporary television broadcast service, temporary sound service information and temporary data service information is selected from the services residing in the TS among a plurality of channels included in the digital broadcast signal received by one carrier frequency, and stored in the memory, and unselected remaining service information is not stored in the memory. Alternatively, one or more of the television broadcasting, radio broadcasting and data broadcasting may not be stored in the memory, and unselective service information may be stored in the memory.

The temporary service information may be a temporary new when a sudden accident or disaster occurs, for example, in which the broadcast time or clock is irregular. The temporary service information does not exist after the broadcasting is ended in several minutes or hours, and may not be necessarily preset and stored in the memory. Accordingly, the temporary service information is preferably kept from being stored in the memory through an operation by operation input unit such as a pushbutton to improve the operability. Thus, it is possible to customize the service information to be preset in the memory according to the user's preference, with more excellent usability.

Also, the temporal service information may be at least one pieces of temporal service information. The digital broadcast receiving apparatus may further include a detection unit for detecting as to whether or not each of temporal service information is received, and a deletion unit, which deletes one temporal service information stored in the memory when the detection unit detects that the one temporal service information is not received.

The service information is deleted from the memory, after the service preset in the memory is not broadcast. Accordingly, if the temporary service information is deleted from the memory, the user is easy to search the desired service information, and there is no fear that the not broadcast service information is displayed to make the operability worse. In this manner, since the service having the irregular broadcast time is preset in the memory after the temporary service, there is no time for broadcasting when that service information is selected at the next time, whereby there is no fear that an extra work is taken when the desired service information is searched.

Moreover, even after the temporary service, in some instances, another temporary service may appear in the TS. Thus, the service information is read from the memory for the temporary service to check periodically whether or not the relevant service information is being broadcast, and if not broadcast, the service information is deleted from the memory.

Also, the digital broadcast receiving apparatus according to the embodiments of the invention may further include a service selection unit for selecting one of the service information stored in the memory, a control unit for controlling at least one of the tuner and the decoding unit to output the selected one service information, in response to an output of the service selection unit.

In this manner, the service selection unit selects the service information stored in the memory. Thereby, the video for the selected service is displayed on a two-dimensional display plane of the display unit and the sound is output to the speaker of acoustic output unit by controlling at least one of the tuner and the decoding unit. Thus, when receiving the digital broadcast signal for a plurality of channels at one carrier frequency, the desired service information is easily selected and received.

BRIEF DESCRIPTION OF THE DRAWINGS

FIG. 14 is a view showing the typical prior technique.

DETAILED DESCRIPTION OF THE PREFERRED EMBODIMENTS

Figure 1:
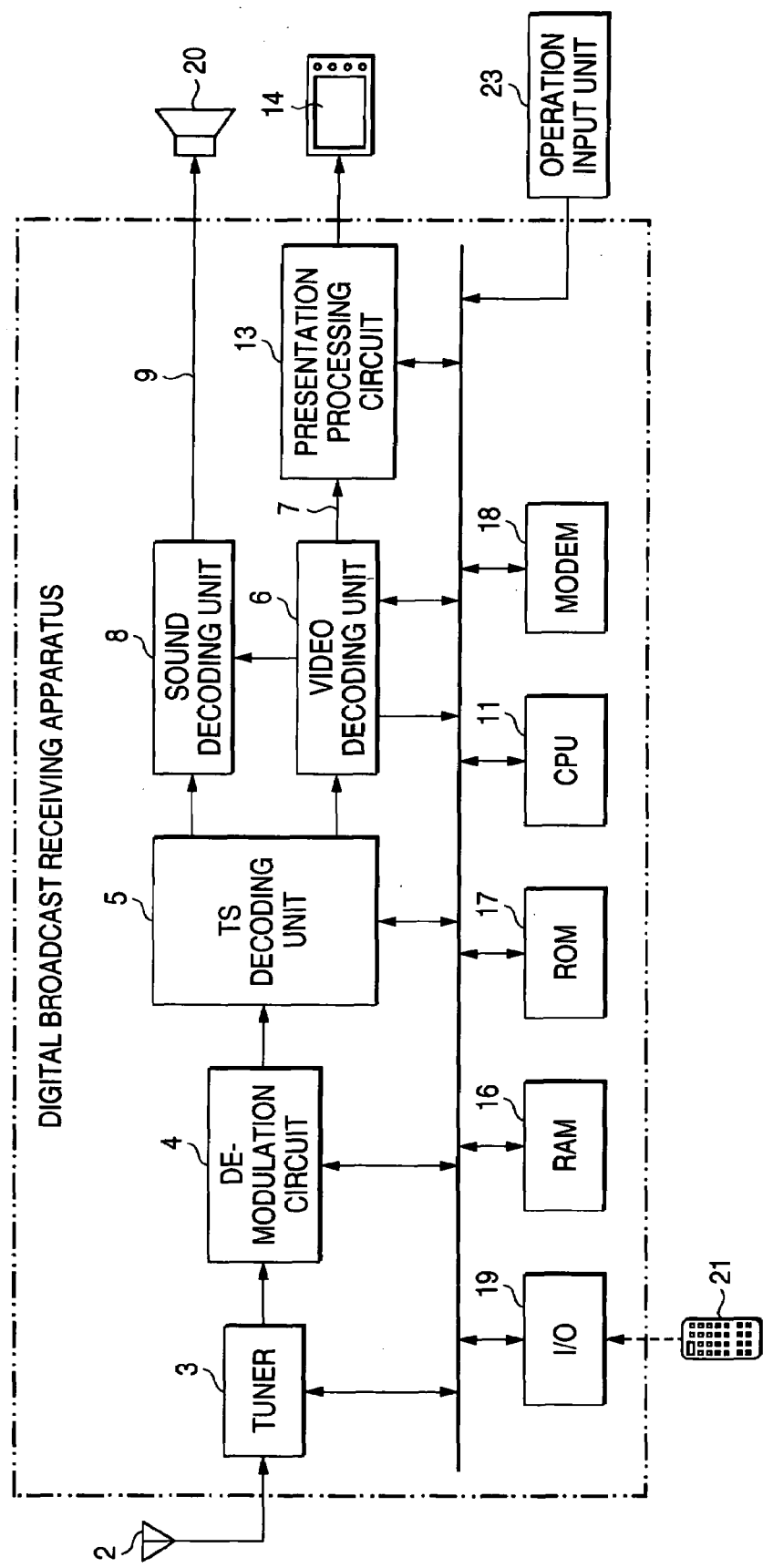
FIG. 1 is a block diagram showing the overall configuration of a digital broadcast receiving apparatus 1 according to one embodiment of the present invention.

FIG. 1 is a block diagram showing the overall configuration of a digital broadcast receiving apparatus 1 according to one embodiment of the invention. A modulated carrier wave of a terrestrial broadcasting or satellite broadcasting received at an antenna 2 is tuned and received by a tuner 3, and demodulated by a demodulation circuit 4 to obtain a digital broadcast signal. This digital broadcast signal is supplied to Transport Stream (abbreviated as TS) decoding unit 5 to produce a TS. The TS is supplied to video decoding unit 6 to produce video data in a line 7 and is supplied to sound decoding unit 8 to produce the sound data in a line 9. A processing circuit 11 constituted by a microcomputer is connected via a bus 12 to the tuner 3, the demodulation circuit 4, the TS decoding unit 5, the video decoding unit 6, and the video decoding unit 8. The processing circuit 11 is further connected to a presentation processing circuit 13 for calculating the video data. A video signal from the presentation processing circuit 13 is supplied to a display unit 14 constituted by a liquid crystal or a cathode ray tube. The video signal is displayed two-dimensionally. The sound data from the sound decoding unit 8 drives a speaker 20 acoustically.

A random access memory 16, a read only memory 17, and a modem 18 for enabling the processing circuit 11 to communicate with a public line are connected to the processing circuit 11 through a bus 12. Furthermore, the processing circuit 11 is connected to a remote operation input unit 21 via an input/output circuit 19.

The digital broadcast signal includes video data, sound data, and other data, which are coded, compressed, and multiplexed in the MPEG compression system such as so called MPEG 2 or MPEG 4. TS is constituted by multiplexing video data and sound data, which are of a plurality of programs. A modulation method for the digital broadcast signal may be OFDM (Orthogonal Frequency Division Multiplex) or QPSK (Quadrature Phase Shift Keying).

Figure 2:
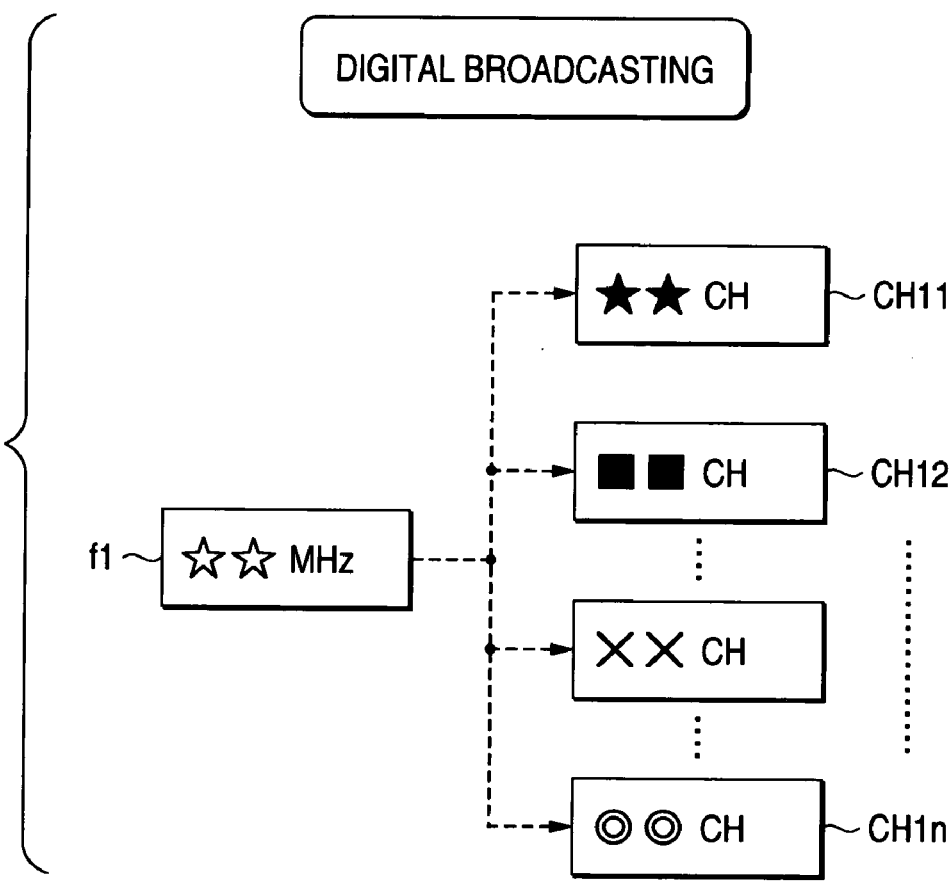
FIG. 2 is a view for explaining a plurality of channels CH11 to CH1n corresponding to a certain carrier frequency received.

FIG. 2 is a view for explaining a plurality of channels CH11 to CH1n corresponding to a certain carrier frequency f1 received. Among the plurality of carrier frequencies, broadcasting having one carrier frequency f1 is received. A digital broadcast signal having the carrier frequency f1 contains service information SI for every n channels CH11 to CH1n. According to the embodiment of the invention, each service information SI is stored in the memory 16 for each of the channels CH11 to CH1n. The display unit 14 displays the stored contents of the memory 16, containing a program name included in each service information SI. An operator operates the remote operation input unit 21 to select a desired program, whereby video is displayed on the display unit 14, and sound is output through the speaker 20.

The display unit 14 is also provided with an operation input unit 23 such as a pushbutton. This operation input unit 23 is connected to the bus 12, whereby an output of the operation input unit 23 is supplied to the processing circuit 11.

Figure 3:
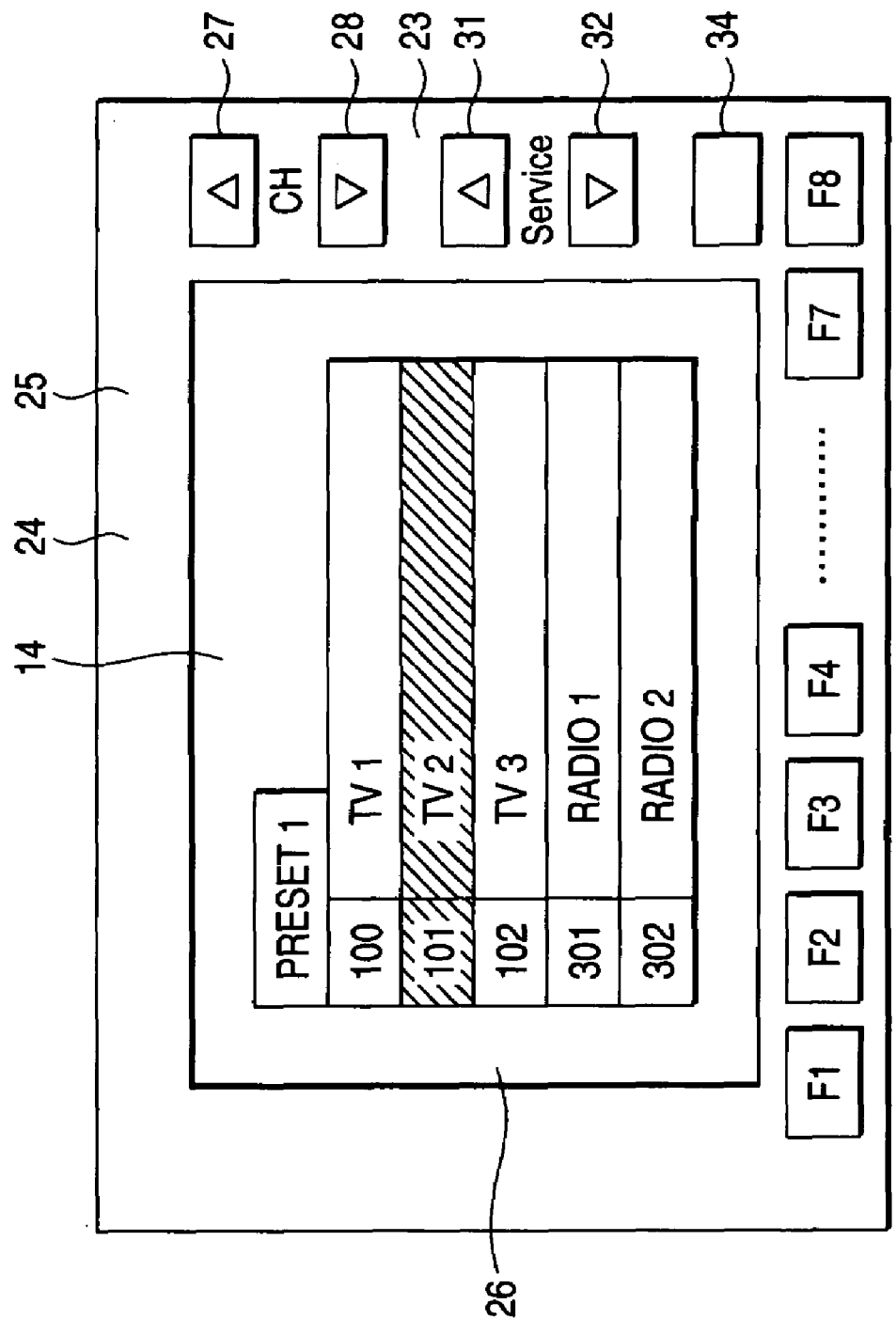
FIG. 3 is a front view of a display operation device 2 in which display unit 14 and operation input unit 23 are integrated.

FIG. 3 is a front view of a display operation device 24 in which the display unit 14 and the operation input unit 23 are integrated. The display unit 14 and the operation input unit 23 are provided within a common casing 25 for the display operation device 24. The service information for every n (e.g., n=5 in this embodiment) channels CH11 to CH1n included in one carrier frequency f1, are displayed on a two-dimensional display plane 26 of the display unit 14. In this embodiment, television broadcastings TV1 to TV3 and radio broadcastings RADIO 1 and RADIO 2 are displayed. Moreover, channels for data broadcasting may be included in one carrier frequency. On a lower area of the display plane of the casing 25, pushbuttons F1 to F8 corresponding to a plurality of carrier frequencies are provided for individually selecting the carrier frequency.

The casing 25 is also provided, on one side of the display plane 26, with a pair of channel selection pushbuttons 27 and 28 for selecting a channel, and a pair of service selection pushbuttons 31 and 32 for selecting a program of service information on each channel. These pushbuttons F1 to F8, 27, 28, 31 and 32 constitute the operation input unit 23. Every time of pressing the pushbuttons 27, 28, the channel is changed one by one in succession. Also, every time of pressing the pushbutton 31, the selected program is changed to upper one. Every time of pressing the pushbutton 32, the selected program is changed to lower one.

Figure 4:
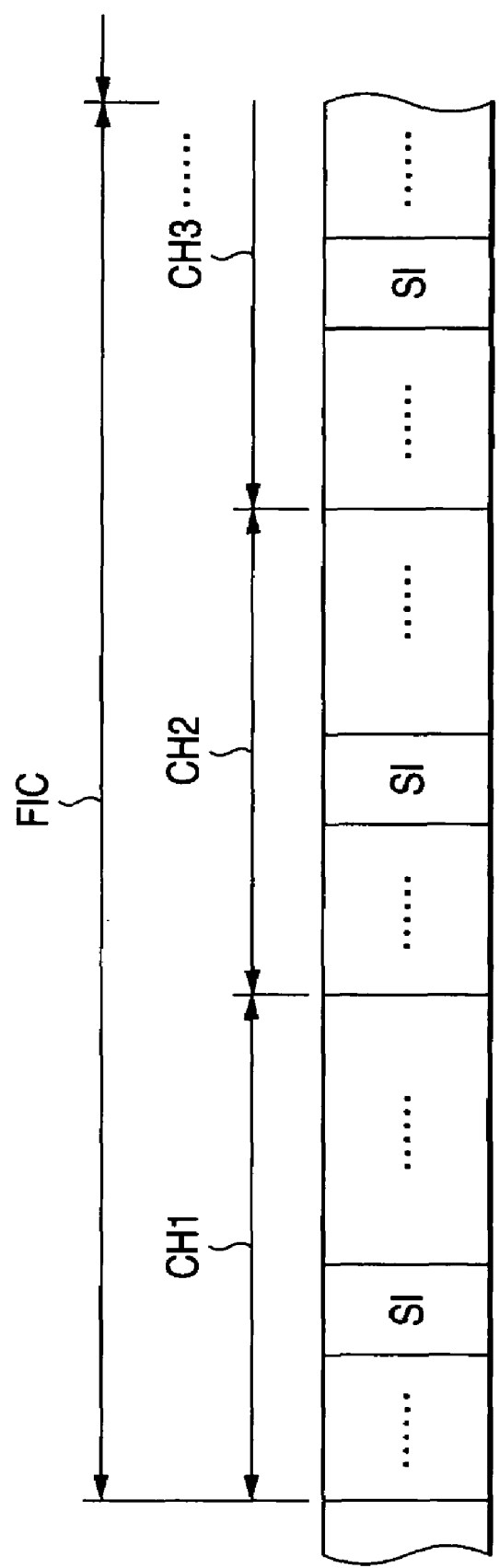
FIG. 4 is a view showing the configuration of a digital broadcast signal included in one carrier frequency.

FIG. 4 is a view showing the configuration of a digital broadcast signal included in one carrier frequency. FIC (Fast Information Channel), which is one of the plurality of channels included in the digital broadcast signal of one carrier frequency, has the service information SI for each of the channels CH11 to CH1n, including a program name, a broadcast date and time, a program list EPG and a program content. Thus, a plurality of channels CH11, CH12, . . . , CH21, CH22, . . . , CH31, CH32, . . . , CHnn included for each carrier frequency f1, f2, . . . , fn involve one or more service information A111, A112, . . . , A121, A122, . . . , B211, B212, . . . , B221, B222, . . . , C311, C322, . . . , C321, C322, . . . , . The configuration of such a digital broadcast signal is indicated in Table 1.

TABLE 1

| Frequency | Channel | Service information |
|---|---|---|
| f1 | CH11 | A111 |
|  |  | A112 |
|  |  | A113 |
|  |  | . . . |
|  | CH12 | A121 |
|  |  | A122 |
|  |  | . . . |
|  | CH13 | A131 |
|  |  | A132 |
|  |  | . . . |
|  | . . . | . . . |
| f2 | CH21 | B211 |
|  |  | B212 |
|  |  | . . . |
|  | CH22 | B221 |
|  |  | B222 |
|  |  | . . . |
|  | . . . | . . . |
| f3 | CH31 | C311 |
|  |  | C312 |
|  |  | . . . |
|  | CH32 | C321 |
|  |  | C322 |
|  |  | . . . |
| . . . | . . . | . . . |

Figure 5:
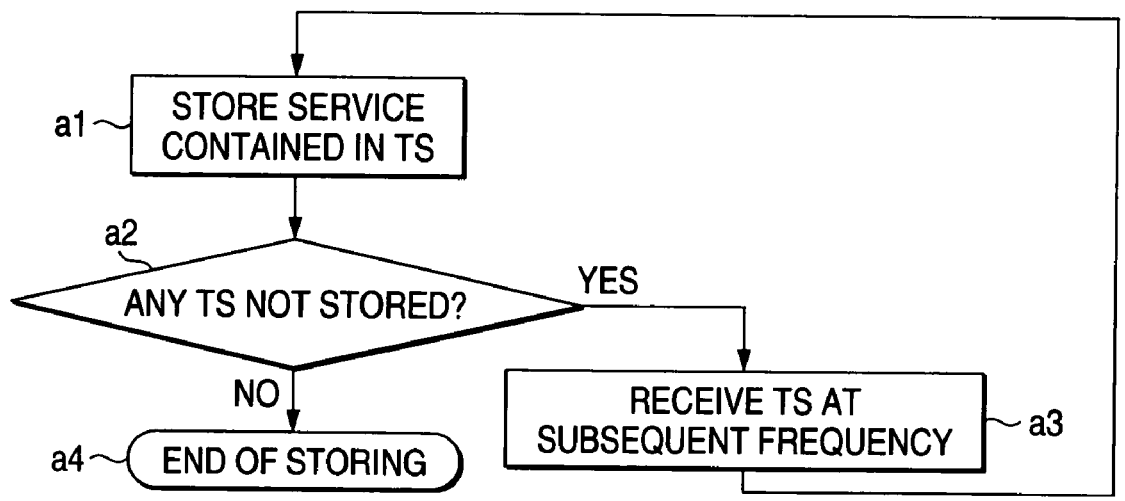
FIG. 5 is a flowchart for explaining an operation for storing in a memory 16 the service information for each of one or more channels included in the digital broadcast signal of one carrier frequency for a processing circuit 11.

FIG. 5 is a flowchart for explaining an operation for storing in the memory 16 the service information SI for each of one or more channels included in the digital broadcast signal at one carrier frequency in the processing circuit 11. At step a1, the processing circuit 11 changes and scans the receiving frequency of the tuner 3 sequentially by operating the pushbutton in the operation input unit 21 or 23, and receives the digital broadcast signal in order from a higher carrier frequency, which has the receiving electric field strength being not smaller than a predetermined value. The processing circuit 11 analyzes an output of the TS decoding unit 5 to extract the service information for each channel, which is contained in the Transport Stream (abbreviated as TS) included in the received digital broadcast signal. Then, the extracted service information is stored in the memory 16.

The digital broadcast signal contains two kinds of program stream PS and transport stream TS. PS is multiplexed data of video data and sound data for one program. TS is multiplexed data of video data and sound data for a plurality of programs.

In this manner, the service information for all the channels included in the digital broadcast signal of one carrier frequency is stored in the memory 16. Then, at step a2, the processing circuit 11 further scans other carrier frequencies to be received having the higher electric field strength. If the processing circuit 11 finds a new carrier frequency, which has not been received, during this scanning, the TS of the digital broadcast signal at the new carrier frequency is received at step s3. Then, the procedure returns to step a1. In this manner, the service information for all the channels included in the TS of the new carrier frequency is stored in the memory 16. Then, receiving the digital broadcast signal at the carrier frequency receivable by the tuner 3 is ended at step a4.

Figure 6:
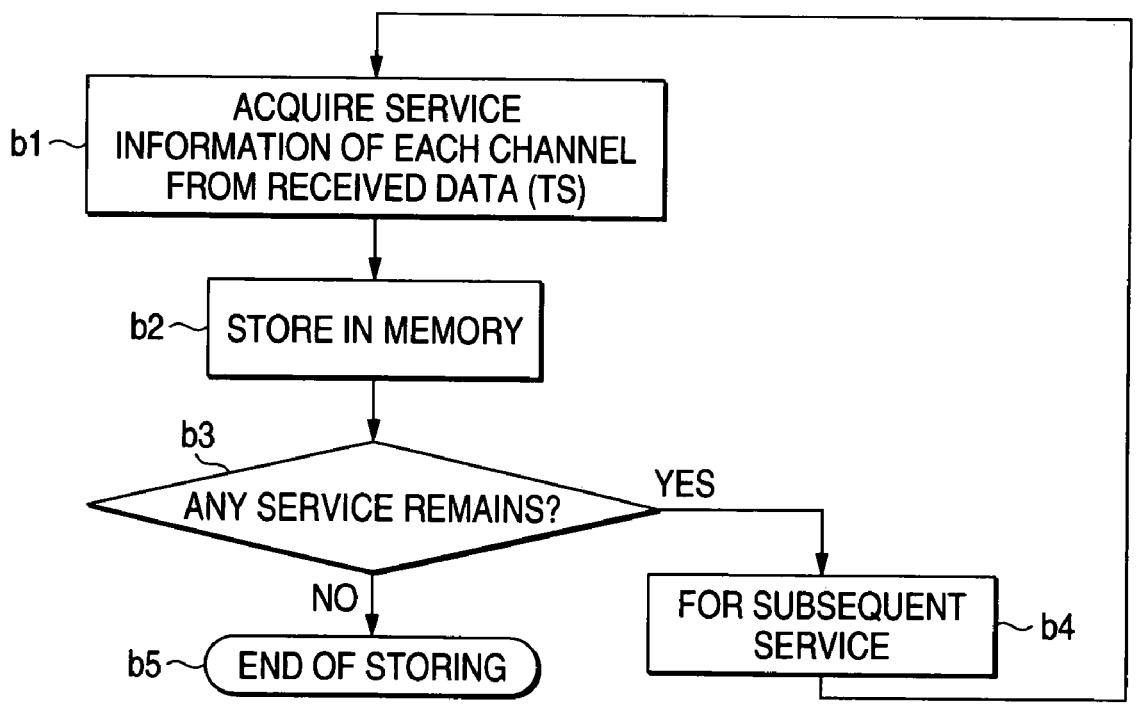
FIG. 6 is a flowchart for explaining a specific operation of the processing circuit 11 at step al of FIG. 5 to store the service information in the memory 16.

FIG. 6 is a flowchart for explaining a specific operation of the processing circuit 11 at step a1 of FIG. 5 to store the service information in the memory 16. At step b1, the processing circuit 11 acquires, from the TS decoding unit 5, the service information of each channel included in the TS, which is the received data of the digital broadcast signal at one received carrier frequency. The processing circuit 11 stores the acquired service information for each channel in the memory 16. Of all the service information included in one channel, if any service information to be stored in the memory 16 remains, the process proceeds from step b3 to step b4, where it is decided to store the remaining service information. Then, at step b1, the remaining service information is stored in the memory 16. In this manner, all the service information for each channel is stored in the memory 16. At step b5, the storing operation is ended.

One or more carrier frequencies f1, f2, . . . , the service information of which is stored in the memory 16, are allotted individually to pushbuttons F1, F2, . . . , of the operation input unit 23, as shown in FIG. 3.

Figure 7:
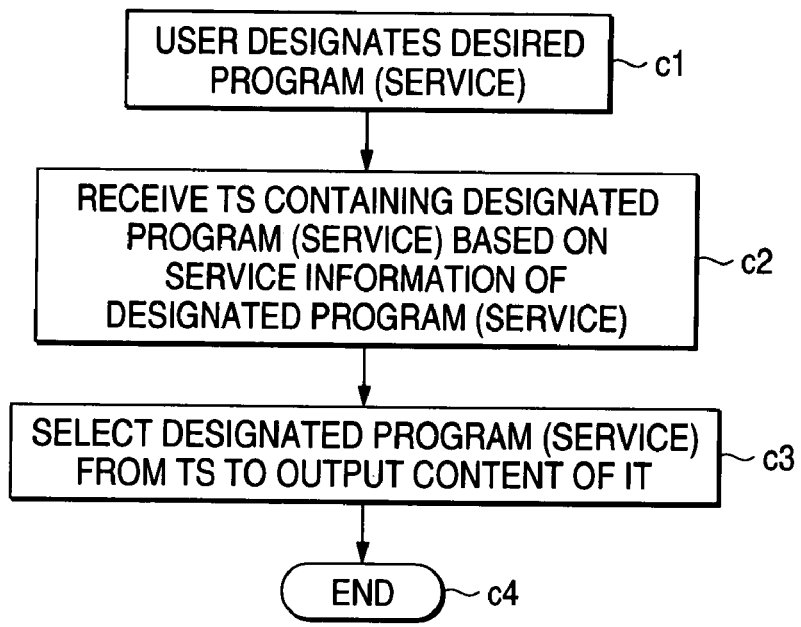
FIG. 7 is a flowchart for explaining an operation of the processing circuit 11 to acquire a program with the display unit 14 and a speaker 20 after the end of a storing operation to the memory 16.

FIG. 7 is a flowchart for explaining an operation of the processing circuit 11 when an operator obtains a program through the display unit 14 and the speaker 20 after the completion of the storing operation into the memory 16. At step c1, the operator presses one of the pushbuttons F1 to F8 for selecting the carrier frequency. If a pushbutton Fi (i=1 to 8) is selected, all the channels of the digital broadcast signal included in the carrier frequency fi are read from the memory 16 and displayed on the display plane 26 as shown in FIG. 3. Then, the operator selects a desired channel by operating the channel selection pushbuttons 27 and 28. The channel selected in this manner is indicated with the oblique line on the display plane 26 as shown in FIG. 3, and is, for example, "101 TV2" channel in FIG. 3. Then, the service information of this selected channel is displayed on the display plane 26 of the display unit 14. The operator designates a desired program by operating the service selection pushbuttons 31 and 32.

In this manner, the operator operates the pushbuttons F1 to F8, 27, 28, 31, and 32 to select the program at step c1. At step c2, the tuner 3 receives TS of the digital broadcast signal including the designated program on the basis of the service information of the designated program. Then, the demodulation circuit 4 demodulates the received TS and the TS decoding unit 5 decodes the demodulated TS.

At step c3, the designated service is selected from the received TS, whereby with regard to its program contents, video data is displayed on the display unit 14 and sound data is output through the speaker 20. The combination of carrier frequency, channel and service information selected in this manner is output subsequently, with corresponding to the number of times of operating the pushbutton 34 included in the operation input unit 23.

Figure 8:
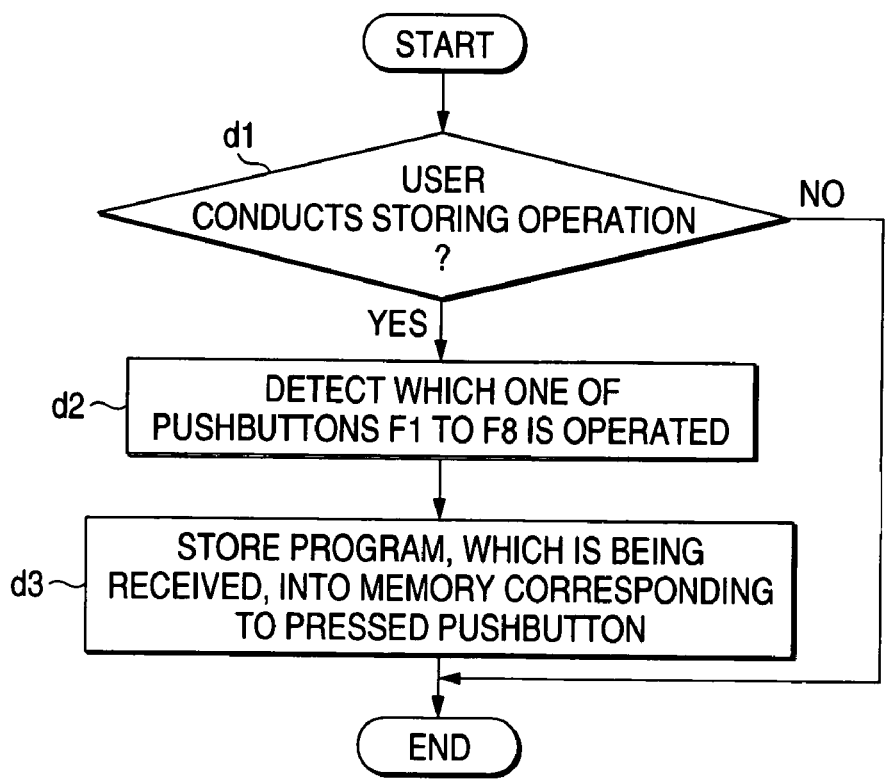
FIG. 8 is a flowchart for explaining an operation of the processing circuit 11 to preset a combination of carrier frequency, channel and service information desired by the user in the memory 16 according to another embodiment of the invention.

FIG. 8 is a flowchart for explaining an operation of the processing circuit 11 according to another embodiment of the invention, to store a combination of carrier frequency, channel, and service information desired by the operator into the memory 16. At step d1, it is checked whether or not the operator conducts any storing operation. If the operator conducts any storing operation, the procedure goes to step d2. If not, the procedure is ended. The storing operation is a predetermined operation including, for example, operating the storing pushbutton and pressing any one of F1 to F8 for longer time (e.g., for 2 or more seconds). At step d2, it is detected which one of the pushbuttons F1 to F8 is pressed. At step d3, the carrier frequency, channel and service information of the program having the contents, which is being received, are stored in the memory corresponding to the pushbutton F1 to F8. Accordingly, if the preset pushbutton is operated, the program contents with a combination of the carrier frequency, channel and service information as listed in Table 2 corresponding to each of the pushbuttons F1 to F8, can be promptly output.

TABLE 2

| Code (corresponding to each pushbutton) | Frequency | Channel | Service information |
|---|---|---|---|
| 1 | f1 | CH11 | A111 |
| 2 | f2 | CH21 | B211 |
| . . . | . . . | . . . | . . . |

Figure 9:
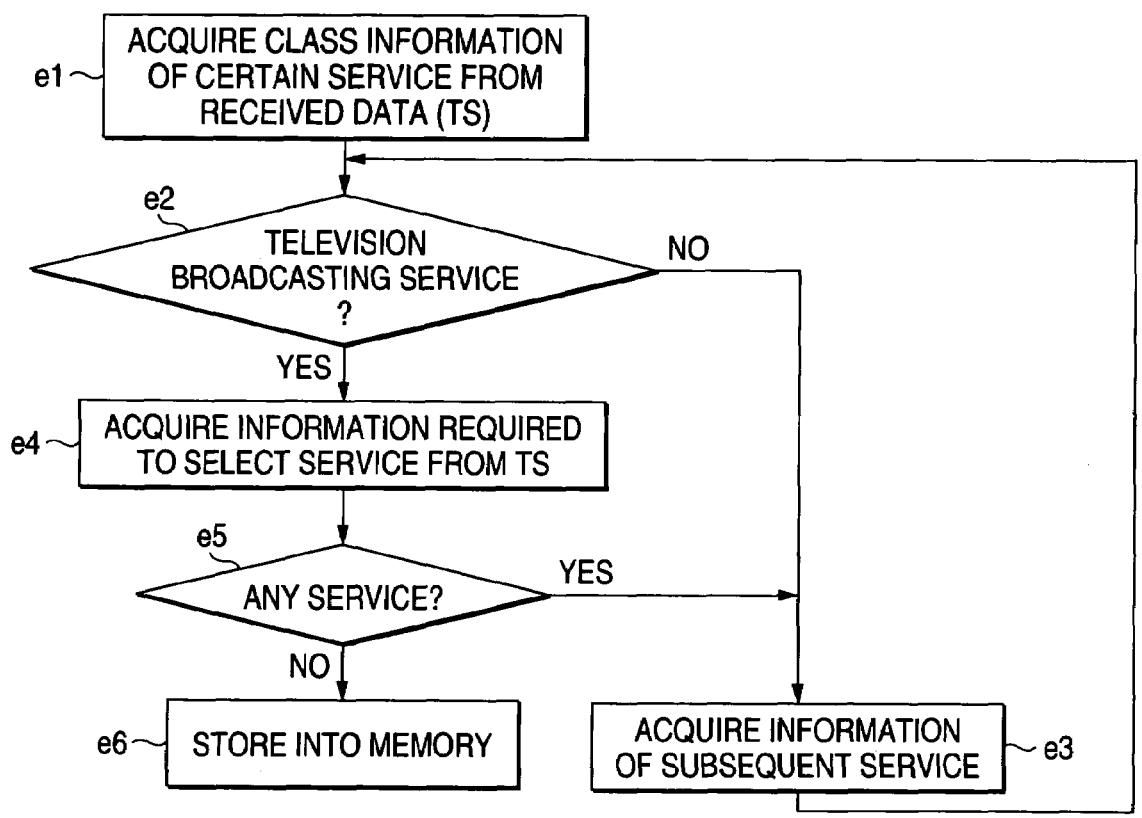
FIG. 9 is a flowchart for explaining an operation of the processing circuit 11 to output the desired service information according to another embodiment of the invention.

FIG. 9 is a flowchart for explaining an operation of the processing circuit 11 according to still another embodiment of the invention, to output desired service information. At step e1, the operator inputs through the operation input unit 23 identification number indicating service information to be output such as a program name. The tuner 3 receives the digital broadcast signal at one carrier frequency based on the input identification number, acquires the service information of each channel from the TS, which is received data included in the received digital broadcast signal, and retrieves the service information to be output from the acquired service information. This desired service information is supposed to be the service information of television broadcasting. At step e2, it is determined whether or not the information included in each of a plurality of channels at one carrier frequency acquired at step e1 is a program service of the television broadcasting. If yes, the procedure proceeds to step e4 at a timing of acquiring a service of the subsequent channel. At step e4, the processing circuit 11 receives information of TS from which the selected service should be retrieved. Then, at step e5, it is determined as to whether or not the selected service exists in TS. If the selected service exists in another channel or the selected service exists in service information of each of plural channels contained in digital broadcasting signals at another carrier frequency with changing to the another carrier frequency, information of service, that is, combination of the carrier frequency, the channel, and the service information is acquired at step e3. The thus obtained combination of the carrier frequency, the channel, and the service information is stored in the memory 16. Accordingly, by operating a prepared pushbutton corresponding to each service information provided in the operation input unit 23, the content of the program with the combination of frequency, channel and service information corresponding to the pushbutton is output from the display device 14 and the speaker 20. In this manner, the operability is enhanced.

Figure 10:
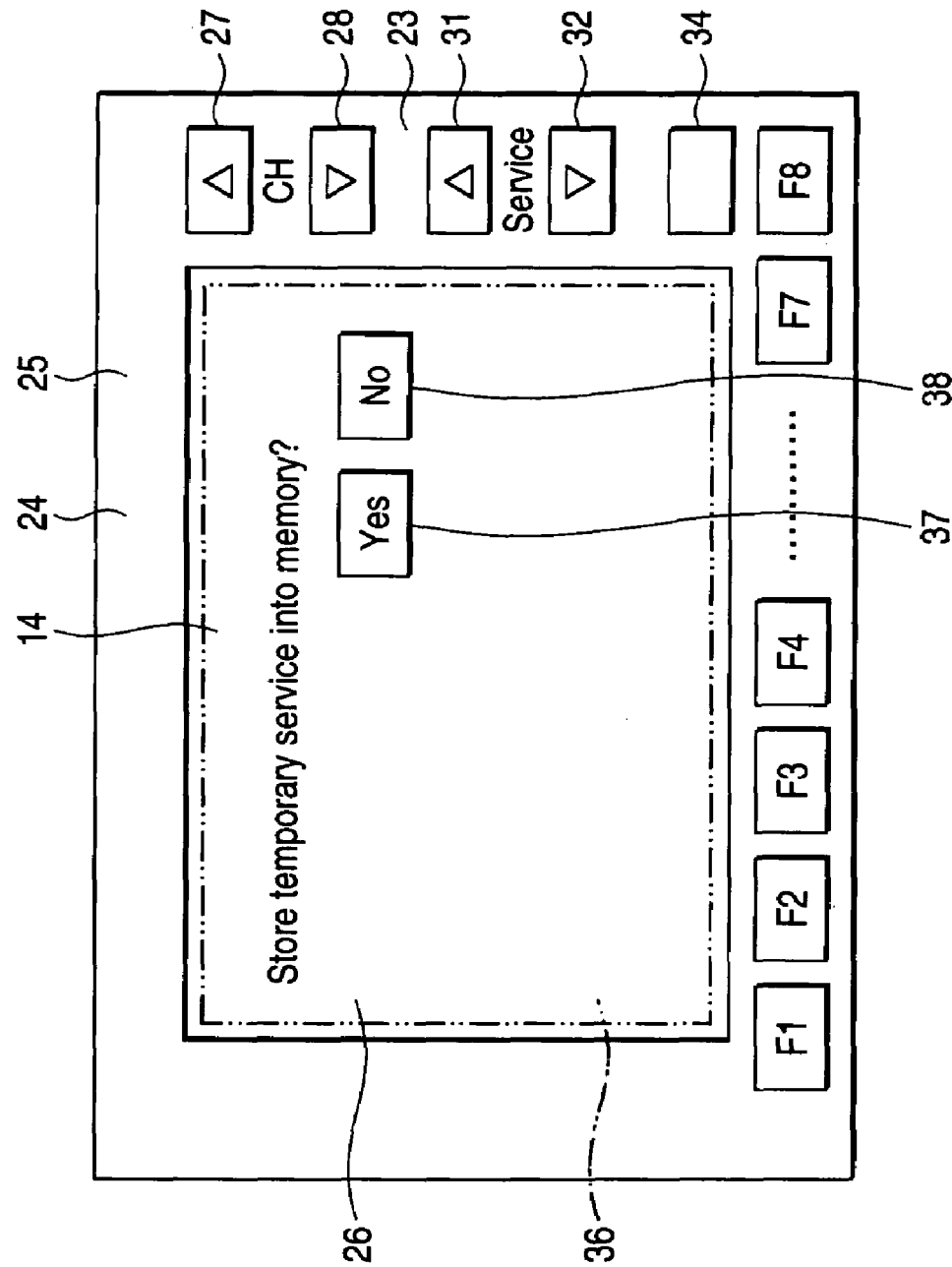
FIG. 10 is a front view of a display operation device 24 in another display format according to another embodiment of the invention.

FIG. 10 is a front view of the display operation device 24 in another display format according to another embodiment of the invention. When a temporary service having irregular broadcast time such as news flash exists in the received digital broadcast signal, a selection is made whether or not the temporary service information corresponding to the temporary service is stored in the memory 16 of temporary service, by operating operation areas 37 and 38 in a translucent two-dimensional planar switch input unit 36 arranged in an upper portion of the display plane 26 of the display unit 14. To store the temporary service into the memory 16, if the operation area 37 is operated, the processing circuit 11 retrieves the service information included in the received digital broadcast signal for the temporary service information, and stores it along with other service information. If the operation area 38 is operated, the temporary service is not output and stored into the memory 16. Thereby, the processing circuit 11 stores residual service information into the memory 16 without storing the temporary service information into the memory 16, even though the temporary service information is included in the service information in the received digital broadcast signal.

Figure 11:
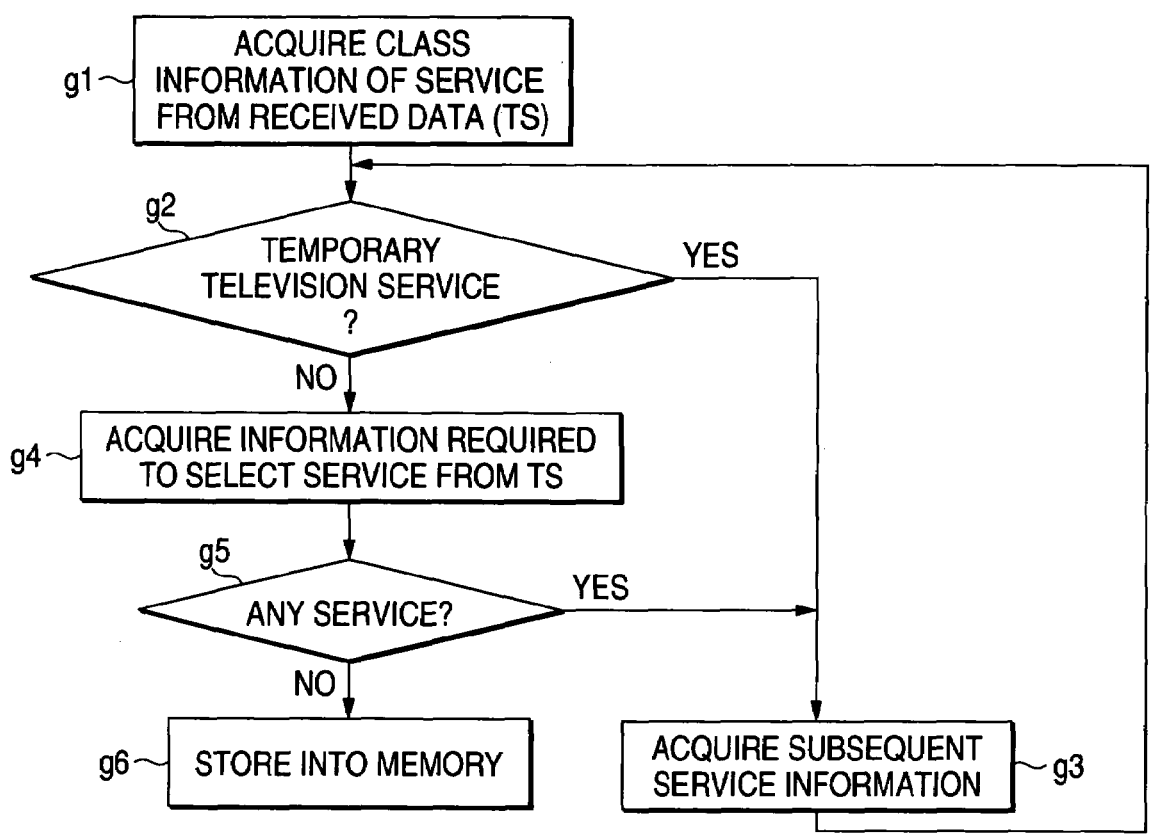
FIG. 11 is a flowchart for explaining an operation of the processing circuit 11 to store in the memory 16 the temporary service information included in a received digital broadcast signal by operating an operation area 37 by pressing switch input unit 36 as shown in FIG. 10.

FIG. 11 is a flowchart for explaining an operation of the processing circuit 11 to store into the memory 16 the temporary service information included in the received digital broadcast signal by operating the operation area 37 by pressing the switch input unit 36 as shown in FIG. 10. At step g1, the service information SI of the TS included in the digital broadcast signal at the received carrier frequency is acquired when the operation area 37 of the switch input unit 36 is operated. The received service information SI includes the temporary service information.

At step g2, a determination is made whether or not the temporary service information is included in the received and acquired service information SI. If the temporary service information is not included, the subsequent service information is retrieved at step g3. The service information included in the TS of the digital broadcast signal at the received carrier frequency is acquired at step g4. The retrieval is continued till the subsequent service information does not exist at step g5. In this manner, all the service information including the temporary service information of the digital broadcast signal at the received carrier frequency is acquired and stored in the memory 16 at step g6. Accordingly, it becomes possible for the operator to operate the operation input unit 23 to output the temporary service information from the display unit 14 and the speaker 20. In the operation of FIG. 11, when the operator does not operate the operation areas 37 and 38 in the switch input unit 36, the processing circuit 11 automatically stores the temporary service information into the memory 16.

Figure 12:
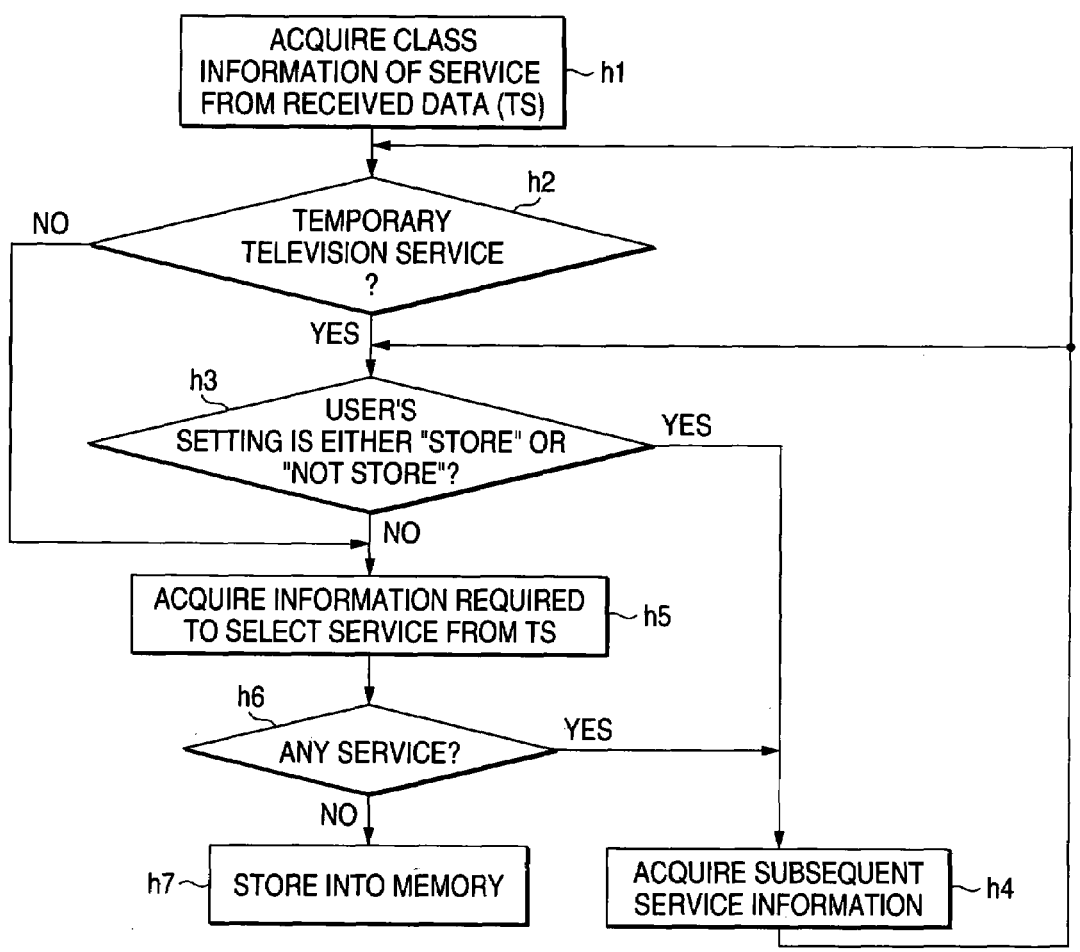
FIG. 12 is a flowchart for explaining an operation of the processing circuit 11 when the user operates the switch input unit 36 in a display area 38 without needing the temporary service information.

FIG. 12 is a flowchart for explaining an operation of the processing circuit 11 when the user operates the switch input unit 36 in the display area 38 without requiring the temporary service information. At step hi, the digital broadcast signal at a certain carrier frequency is received, and the service information is acquired from the TS, which is the received data included in the digital broadcast signal. If the acquired service information is the temporary service, a determination is made whether or not it is necessary to store the temporary service, on the basis of the switch pressing operation on the display areas 37 and 38. If the operation area 38 is pressed, the procedure transfers to step h5 without storing the temporary service information in the memory 16. New service information is acquired from the TS at step h5. In this manner, a determination is made whether or not further service information exists at step h6. If the service information to be acquired subsequently exists, the subsequent service information is acquired at step h4, and then the procedure transfers to step h2.

Figure 13:
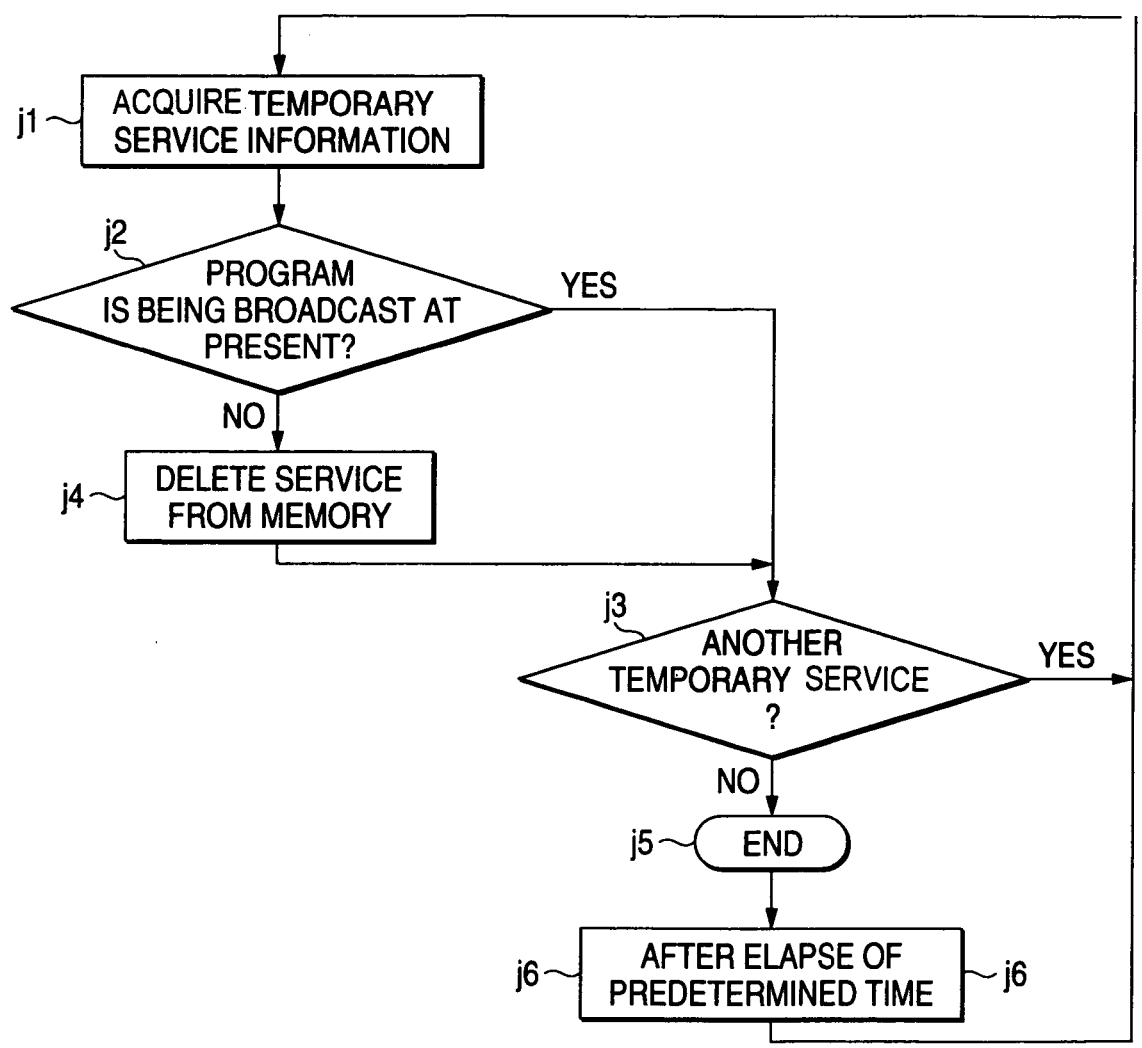
FIG. 13 is a flowchart for explaining an operation of deleting the temporary service information of the processing circuit 11 regarding the temporary service information.

With regard to the temporary information, FIG. 13 is a flowchart for explaining an operation of the processing circuit 11 at a time of deleting the temporary service information. At step j1, the temporary service information is acquired from the received digital broadcast signal. At step j2, a determination is made whether or not the program contents of the temporary service information is broadcast at the determination time of step j1. If not broadcast, the temporary service information is deleted from the memory 16 at step j4. If it is determined that the program of the temporary service information is broadcast at step j2, a determination is made whether or not any other temporary service information exists in the TS of the received digital broadcast signal at step j3. If any other temporary service information exists, the procedure returns to step j1. If it is determined that the temporary service information is not included in the digital broadcast signal at step j3, a retrieval operation for digital broadcast signal is ended at step j5. After the elapse of a certain time at step j6, the procedure returns to step j1. Thus, if the temporary service information is not broadcast, the temporary service information is automatically deleted from the memory 16.

According to the embodiments of the invention, the service information for a plurality of channels at one carrier frequency is extracted and stored into the memory. Thereby, the desired service or program for each channel is easily acquired.

What is claimed is:

1. A digital broadcast receiving apparatus comprising:
   a tuner for receiving a coded digital broadcast signal, wherein the tuner scans carrier frequencies of the digital broadcast signal to receive a first carrier frequency;
   a decoding unit for decoding and outputting the received digital broadcast signal at the first carrier frequency;
   an extraction unit for extracting service information of each of a plurality of channels from the decoded digital broadcast signal at the first carrier frequency; and
   a memory for storing the extracted service information, wherein after the memory stores the extracted service information, the tuner automatically scans the carrier frequencies to receive a second carrier frequency different from the first carrier frequency, the decoding unit decodes and outputs a second received digital broadcast signal at the second carrier frequency, and the extraction unit extracts service information of each of a plurality of channels from a decoded second digital broadcast signal at the second carrier frequency.

2. The digital broadcast receiving apparatus according to claim 1, wherein:
   the service information is a plurality of pieces of service information;
   each of the channels contains a plurality of services; and
   the pieces of service information relate to the services, respectively.

3. The digital broadcast receiving apparatus according to claim 1, further comprising:
   a broadcast selection unit for selecting one from a group consisting of a television broadcast, a radio broadcast, and a data broadcast; and
   a first storage unit for storing the service information of the selected one into the memory.

4. The digital broadcast receiving apparatus according to claim 1, further comprising:
   a storage selection unit for selecting as to whether or not to store temporary service information into the memory; and a second storage unit, which stores the temporary service information into the memory when the storage selection unit selects to store the temporary service information into the memory.

5. The digital broadcast receiving apparatus according to claim 4, wherein the temporary service information is at least one of the pieces of temporary service information, the digital broadcast receiving apparatus further comprising:

a detection unit for detecting as to whether or not each of temporary service information is received; and a deletion unit, which deletes one temporary service information stored in the memory when the detection unit detects that the one temporary service information is not received.

6. The digital broadcast receiving apparatus according to claim 1, further comprising:

a service selection unit for selecting one of the pieces of service information stored in the memory; and a control unit for controlling at least one of the tuner and the decoding unit to output the selected one service information, in response to an output of the service selection unit.

7. A method for receiving a digital broadcast, the method comprising:

receiving a coded digital broadcast signal;

scanning carrier frequencies of the digital broadcast signal to receive a first carrier frequency;

decoding and outputting the first carrier frequency of the digital broadcast signal;

extracting service information of each of a plurality of channels from the decoded digital broadcast signal at the first carrier frequency;

storing the extracted service information;

automatically scanning the carrier frequencies to receive a second carrier frequency different from the first carrier frequency;

decoding and outputting a second received digital broadcast signal at the second carrier frequency; and extracting service information of each of a plurality of channels from a decoded second digital broadcast signal at the second carrier frequency.

* * * * *